United States Patent [19]

Veeck

[11] Patent Number: 5,339,218
[45] Date of Patent: Aug. 16, 1994

[54] SURFACE MOUNT DEVICE

[75] Inventor: Robert Veeck, Woodland Hills, Calif.

[73] Assignee: Microsemi Corporation, Santa Ana, Calif.

[21] Appl. No.: 63,763

[22] Filed: May 20, 1993

[51] Int. Cl.⁵ .............................................. H05K 7/20
[52] U.S. Cl. .................................... 361/707; 257/706; 361/719; 361/767
[58] Field of Search .................. 165/80.3, 185; 174/16.3, 252; 257/705, 706, 707, 713; 361/688, 704, 706, 707, 712, 713, 717, 718, 767, 768, 772, 705, 719

[56] References Cited

U.S. PATENT DOCUMENTS

| | | | |
|---|---|---|---|
| 3,763,403 | 10/1973 | Lootens | 317/234 R |
| 4,067,041 | 1/1978 | Hutson | 357/80 |
| 4,069,497 | 1/1978 | Steidlitz | 357/80 |
| 4,117,508 | 9/1978 | Koenig | 357/81 |
| 4,509,096 | 4/1985 | Baldwin | 361/386 |
| 4,583,283 | 4/1985 | Dubois et al. | 29/589 |
| 4,788,584 | 11/1988 | Hirano et al. | 357/81 |
| 5,079,618 | 1/1992 | Farnworth | 357/81 |
| 5,130,888 | 7/1992 | Moore | 361/386 |

Primary Examiner—Gerald P. Tolin
Attorney, Agent, or Firm—Gary C. Honeycutt

[57] ABSTRACT

A circuit board assembly comprising a surface-mounted microelectronic device combination, including a metallic base member having an insulating layer thereon, and a plurality of electrically conductive mounting pads patterned on the insulating layer. At least one pair of hermetically sealed diodes is bonded to the pads, such that each diode of each pair has one terminal bonded to a first pad, and the other terminal bonded to second and third pads, respectively. For example, a two-diode combination is provided with three leads, one for each pad, whereby various lead connections may be selected, for the purpose of using each diode separately; or for the purpose of using both diodes, either in series or in parallel.

5 Claims, 2 Drawing Sheets

SURFACE MOUNT DEVICE

BACKGROUND

This invention relates to circuit board technology, and more particularly to a versatile surface mount assembly, including a heat sink for microelectronic devices, such as diodes or capacitors to be included in a circuit board.

Surface mount technology is generally defined as relating to any assembly that permits a microelectronic component to be mounted on a circuit board surface without the need for a plug-in socket, or through-hole solder.

Printed circuit board technology and surface mount technology have evolved in parallel to satisfy the requirements of high-density packaging specifications. Surface mount technology frees both sides of a circuit board to carry a large number of components, thereby substantially increasing overall circuit density.

SUMMARY OF THE INVENTION

The invention is directed to a surface-mounted microelectronic device combination, for use in a circuit board assembly, comprising a metallic heat-sink base member having a thermally-conductive insulating layer bonded thereto, and a plurality of electrically conductive mounting pads patterned on the insulating layer. At least one pair of two-terminal microelectronic components is bonded to the pads in a variety of configurations.

For example, in a two-diode, three-pad configuration, each diode has one terminal bonded to a first pad, and its other terminal bonded to the second and third pads, respectively. The combination is provided with three leads, one bonded to each pad, whereby the first and second leads may be electrically connected to select one diode for use in a circuit; or the first and third leads may be electrically connected to select both diodes for use in series. Still further, all three leads may be connected such that the two diodes are electrically parallel. Each lead extends beyond one edge of the base member, and is shaped to provide a lead segment that is substantially coplanar with the opposite side of the base member.

DETAILED DESCRIPTION

Figure 1:
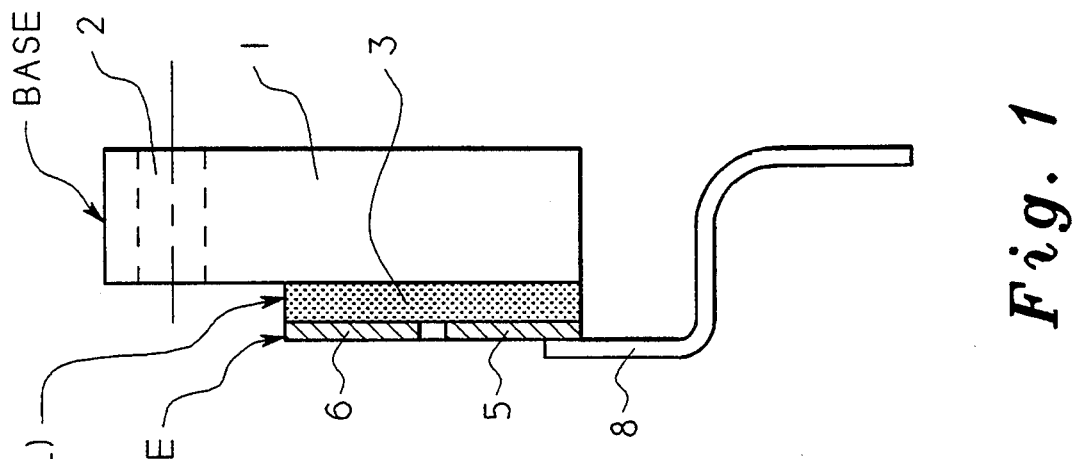
FIG. 1 is a side view of one example of the package of the invention.

As shown in FIG. 1 the package includes a base member 1 having an opening 2 therein for attachment to a heat sink or circuit board, an insulating layer 3 bonded to the base member, mounting pads 4, 5 and 6 bonded to the insulating layer, and leads 8 and 9 bonded to the pads. Alternatively, the leads may be integral extensions of the respective pads. In a preferred embodiment, base 1 is composed of copper, a copper alloy, or a thermally conductive copper-molybdenum-copper laminate. Layer 3 is preferably beryllia, alumina, or aluminum nitride. The mounting pads and leads are preferably copper, and are shaped to provide a portion thereof lying substantially in the same plane as the back-side of the base member.

Figure 2:
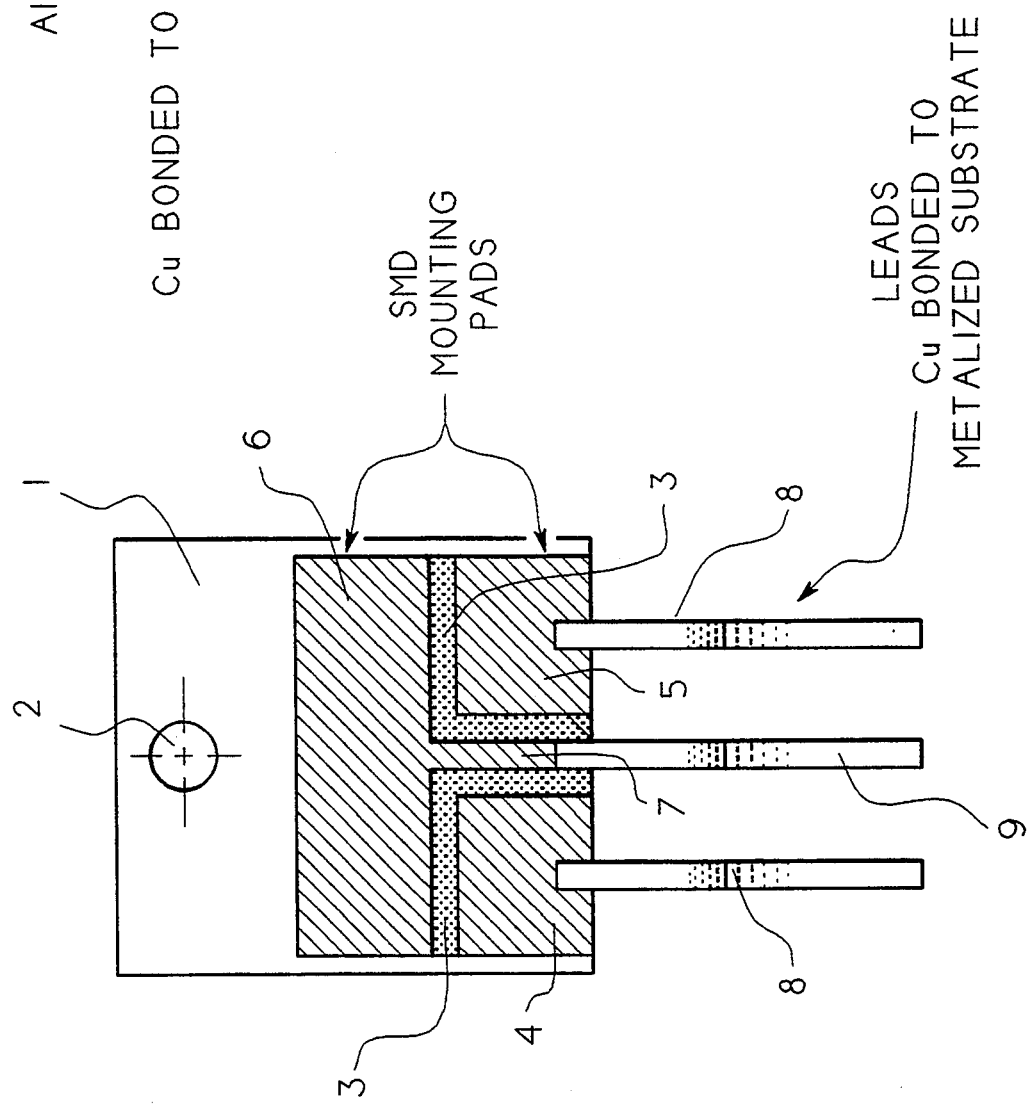
FIG. 2 is a top view of the package shown in FIG. 1.

As shown in FIG. 2, pads 4, 5, and 6 are patterned to provide pad 6 with a central leg 7 extending between pads 4 and 5, so that leads 8 and 9 may readily be attached along one edge of the base member. This configuration permits a first device component, usually a diode or capacitor, to be mounted such that it bridges the space between pads 4 and 6, while a second component is mounted to bridge the space between pads 5 and 6.

Figure 3:
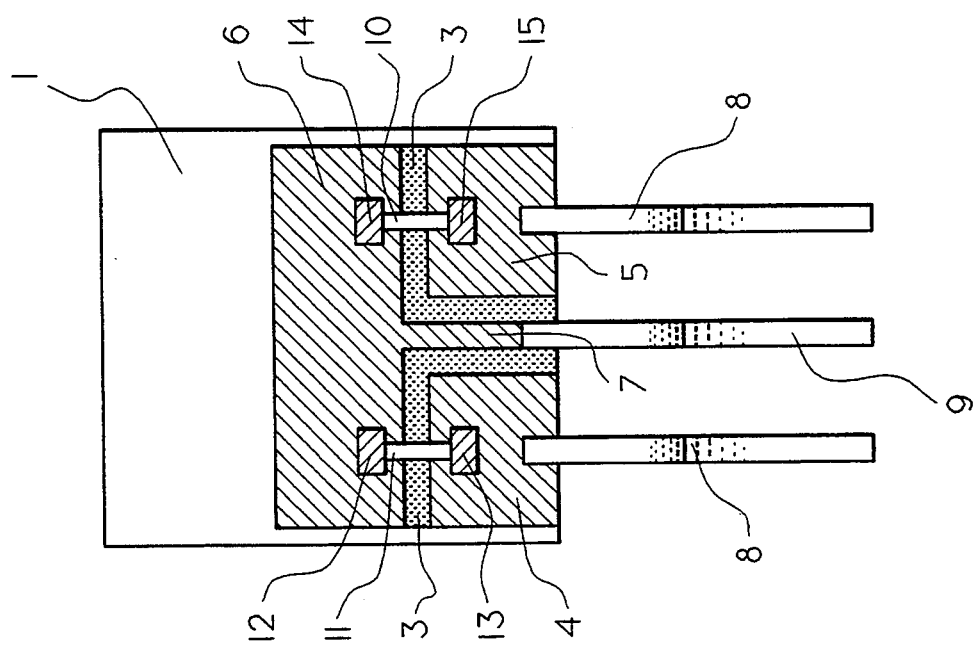
FIG. 3 is a top view of the package of FIGS. 1 and 2, further including two hermetically sealed diodes mounted thereon.

As shown in FIG. 3, two diodes 10 and 11 are mounted in a versatile configuration, by bonding lead tabs 12, 13, 14 and 15 to pads 4, 5 and 6, such that each diode may be selected for separate connection into a circuit; or, by connecting only the two outside leads into a circuit, both diodes may be used in series. For a parallel electrical connection of the diodes, the central lead becomes one terminal, and the two outer leads are connected together as the other terminal. Note particularly that each diode is hermetically sealed in glass, for example, prior to its bonding to pads 8 and 9. This assembly is used to replace the standard TO254 through TO259 semiconductor device packages, by selecting a length, width, and height for base member 1 equal to the dimensions of the standard packages.

Figure 4:
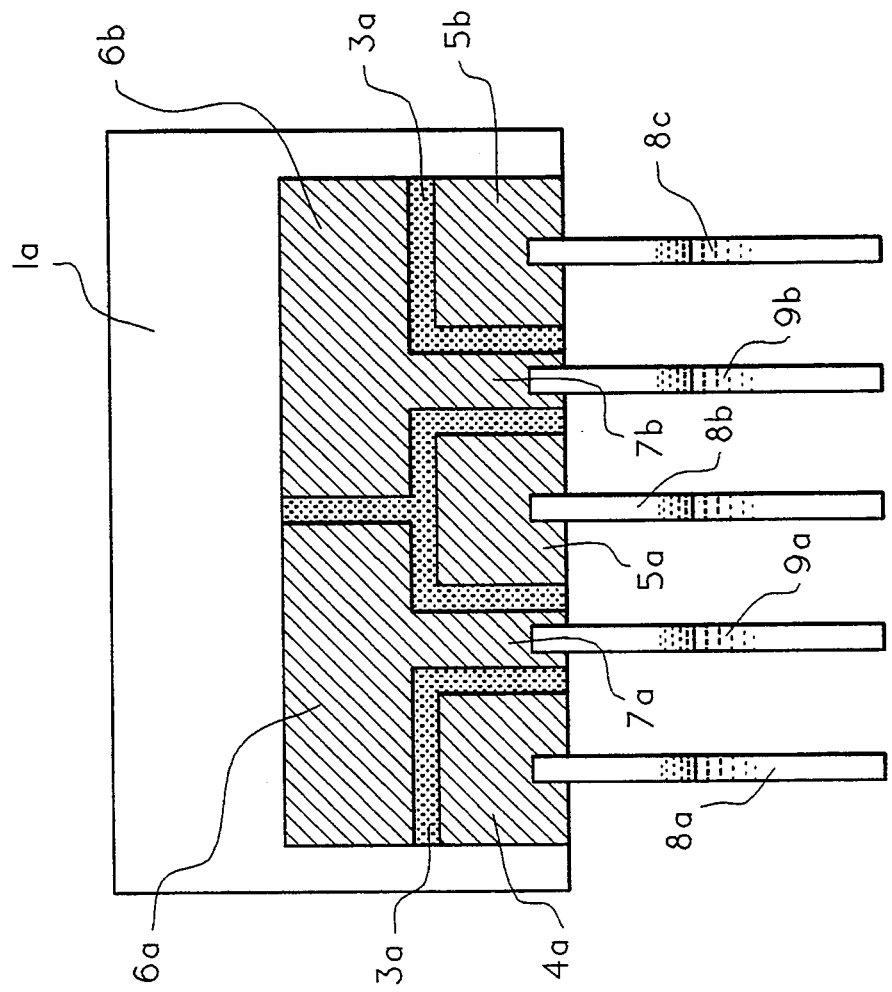
FIG. 4 is a top view of an alternate embodiment of the invention, showing two pairs of components mounted on a package having five pads and five leads.

As shown in FIG. 4, a five-pad configuration is used to accommodate four components. That is, one diode is connected between pads 4a and 6a; one between pads 5a and 6a; one between 5a and 6b; and one between 5b and 6b. Thus, one, two, three, or all four components may be selected for connection into a single circuit; or two circuits may share selected components. Whenever a lead becomes superfluous because of a particular selection of components, it may be clipped off, or simply left unconnected.

What is claimed is:

1. A circuit board assembly comprising a surface-mounted microelectronic device combination, including:

a metallic base member having a layer of electrical insulation bonded thereto;

at least three metallic mounting pads patterned on the surface of said insulation layer;

a first hermetically sealed diode mounted thereon, having one terminal bonded to the first of said pads, and the other terminal bonded to the second of said pads;

a second hermetically sealed diode mounted thereon, having one terminal bonded to said second pad, and the other terminal bonded to the third pad; and at least three elongated metallic leads, each having a first segment bonded to or integral with one of said pads, respectively, and a second segment extending beyond one edge of said base member, shaped to include a portion thereof substantially in the same plane as the lower surface of said base member, connected to at least one circuit of the circuit board.

2. An assembly as in claim 1 wherein the base member is a metallic heat sink, and said insulating layer is comprised of a heat-conductive dielectric material.

3. An assembly as in claim 1 wherein said pads consist of two substantially rectangular pads separated by the centrally extended leg of a T-shaped pad.

4. An assembly as in claim 1 wherein five pads and four diodes are included, the first and second of which pads are separated by the vertically extended leg of a third, T-shaped pad; and the second and fifth of which pads are separated by the vertically extended leg of a fourth, T-shaped pad.

5. A microelectronic device combination for surface-mounted assembly onto a circuit board, comprising:
- a metallic base member having substantially planar upper and lower surfaces;
- a thin layer of electrically insulating material bonded to the upper surface of said base member:
- at least three metallic mounting pads patterned on the surface of said insulating layer;
- a first hermetically sealed two-terminal component having one terminal bonded to the first of said pads, and the other terminal bonded to the second of said pads;
- a second hermetically sealed two-terminal component having one terminal bonded to the second pad, and the other terminal bonded to the third pad; and
- at least three elongated metallic leads, each having a first segment bonded to or integral with one of said three pads, respectively, and a second segment extending beyond one edge of said base member, shaped to include a portion thereof substantially in the same plane as the lower surface of said base member, to enable surface-mounted connection onto a circuit board.

* * * * *